United States Patent [19]
Hathaway et al.

[11] Patent Number: 5,636,372
[45] Date of Patent: Jun. 3, 1997

[54] NETWORK TIMING ANALYSIS METHOD WHICH ELIMINATES TIMING VARIATIONS BETWEEN SIGNALS TRAVERSING A COMMON CIRCUIT PATH

[75] Inventors: David J. Hathaway, Underhill Center; Janet P. Alvarez, South Burlington, both of Vt.; Krishna P. Belkhale, Wappingers Falls, N.Y.

[73] Assignee: International Business Machines Corporation, Armonk, N.Y.

[21] Appl. No.: 316,519

[22] Filed: Sep. 30, 1994

[51] Int. Cl.$^6$ .................................................. G06F 17/18
[52] U.S. Cl. .................................... 395/555; 364/491
[58] Field of Search ............................ 364/490, 491, 364/576, 578; 395/550

[56] References Cited

U.S. PATENT DOCUMENTS

| | | | |
|---|---|---|---|
| 4,698,760 | 10/1987 | Lembach et al. | 364/490 |
| 4,827,428 | 5/1989 | Dunlop et al. | 364/491 |
| 4,907,180 | 3/1990 | Smith | 364/578 |
| 4,924,430 | 5/1990 | Zaslo et al. | 364/578 |
| 5,095,454 | 3/1992 | Huang | 364/578 |
| 5,282,148 | 1/1994 | Poirot et al. | 364/491 |

OTHER PUBLICATIONS

IBM Tech. Disc. Bulletin, vol. 28, No. 11, Apr. 1986 "Timing Influenced Layout Design", pp. 4981–4988.

*Primary Examiner*—Thomas M. Heckler
*Attorney, Agent, or Firm*—Calfee Halter & Griswold

[57] ABSTRACT

A method of analyzing timing differences between arrival times of distinct signals propagating through a circuit comprising: (i) identifying a first beginning point for a first data path over which data arrival times are propagated to a data endpoint; (ii) identifying a second beginning point for a second data path to the data endpoint, and for a clock path to a clock endpoint, the endpoints constituting an endpoint pair; (iii) identifying at least one common point at which the second data path and the clock path diverge; (iv) propagating data arrival times to the data endpoint from the first and second beginning points, and tagging the data arrival times propagated along the second data path with one of the common points; (v) propagating clock arrival times to the clock endpoint from the second beginning point along the clock path, and tagging the clock arrival times with one of the common points, the data and clock arrival times constituting clock/data arrival time pairs at the endpoint pair; (vi) determining the slack at the endpoint pair for the time pairs and identifying a worst time pair causing the worst slack determination; and (vii) recomputing the slack at the endpoint pair for the worst time pair, if the data arrival time in the worst time pair is tagged with the same common point, by eliminating slack caused by data and clock arrival time propagation on a shared portion of the second data path and the clock path between the second beginning point and the same common point.

7 Claims, 4 Drawing Sheets

NETWORK TIMING ANALYSIS METHOD WHICH ELIMINATES TIMING VARIATIONS BETWEEN SIGNALS TRAVERSING A COMMON CIRCUIT PATH

TECHNICAL FIELD

The present invention relates generally to the field of statistical timing analysis of logic circuitry, and more particularly to an efficient method for analyzing the timing characteristics of logic networks in such circuitry prior to physically implementing the circuitry in hardware.

BACKGROUND OF THE INVENTION

In computer systems, logic networks are used to perform a variety of functions. These networks are typically implemented in hardware form, for example, on VLSI (very large scale integration) integrated circuits. VLSI technology has enabled the fabrication of electronic circuits which provide hundreds of thousands of transistors in a single integrated circuit chip. Logic elements are constructed using one or more of these transistors, and the logic networks on the integrated circuit are constructed with the logic elements. Each integrated circuit chip may contain thousands of logic networks.

The logic elements (or gates) in a logic network are interconnected by conductive paths. Signals propagate through the network along these conductive paths through associated logic gates. The time it takes for a given signal to propagate through a particular logic network is a measurable parameter, which is in part determinant on inherent delays associated with both the logic gates and the conductive paths through which the signal passes. The length of the conductive paths is also a factor which determines this delay time.

Figure 1:
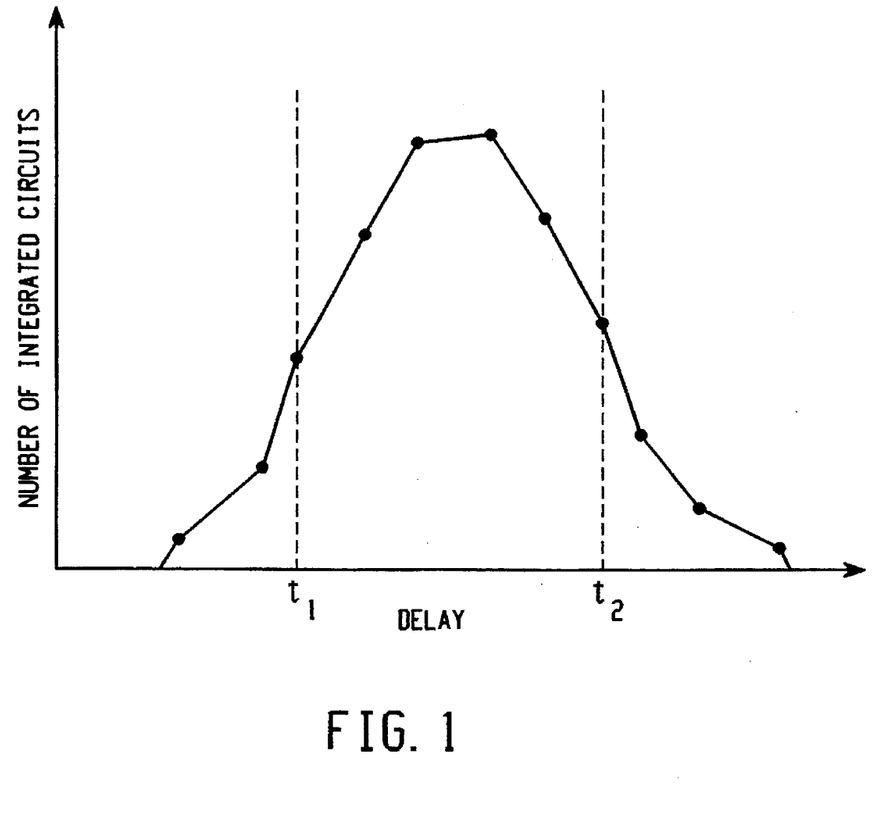
FIG. 1 is a normal distribution of total delay times for a signal to pass through a logic network implemented over a large number of integrated circuit chips.

The total delay time for a signal to pass through the same type of logic network implemented over a large number of integrated circuit chips may be approximated as a Gaussian or normal distribution. FIG. 1 shows such a distribution. The horizontal axis represents the total delay measured for a particular type of logic network implemented in a number of integrated circuits, and the vertical axis represents the number of integrated circuits.

The total delay time varies from integrated circuit chip to integrated circuit chip due in part to physical differences in the integrated circuit chips in which the logic networks are implemented. These differences are caused, for example, by physical variances in raw material used to construct the chip and minor changes in production processes, both of which may vary over many production batches, as well as variances in the environmental conditions to which the chips are exposed (e.g., temperature, supply voltage, etc.). Because the entire range of speed variations under the curve of FIG. 1 applies to the accumulated production of a process line over many days, batches, and raw materials, it is extremely unlikely that two implementations of a logic network on a single die produced on a common silicon substrate would exhibit delays at the extremes of the curve. For chips that exhibit the fastest response times, even relatively slow networks would exhibit speeds near the left half of the curve (to the left of t1). For chips that exhibited the slowest behavior, the vast majority of the times encountered for networks on such a chip would be located near the right half of the curve (to the right of t2).

The types of signals which propagate across a logic network include clock and data signals. Logic networks which utilize both clock and data signals often rely on close synchronization of these signals for the networks to operate properly. Data or clock signals are designed to arrive at particular logic gates at precise times before or after the other. If, for example, a clock or data signal is expected at a particular logic gate in the network, and that clock or data signal arrives too early or late with respect to the other, the network may either hang up or provide incongruous output results.

Accordingly, manufacturers of integrated circuits have developed delay tolerances which must be met by a particular integrated circuit for it to pass inspection and insure that logic networks within the integrated circuit will operate properly. Timing analysis is preferably performed on proposed network designs prior to the actual physical layout of the logic networks. The proposed network designs are analyzed to determine unknown parameters of the networks which may prevent the correct timing operation of the network.

As the design of logic networks in computers becomes more complex, and as the speeds of operation of these networks continue to increase, the synchronization of the timing sequences of the logic elements in these networks must necessarily become tighter. Accordingly, the pre-fabrication analysis of the timing of these logic networks must become increasingly more accurate, and the subsequent re-design of the circuits must become more efficient. Timing analysis of complex, high speed digital network designs is required both to determine if a predetermined performance objective has been met by the design, and to provide information helpful in the redesign of networks which fail to meet such a performance objective.

Figure 2:
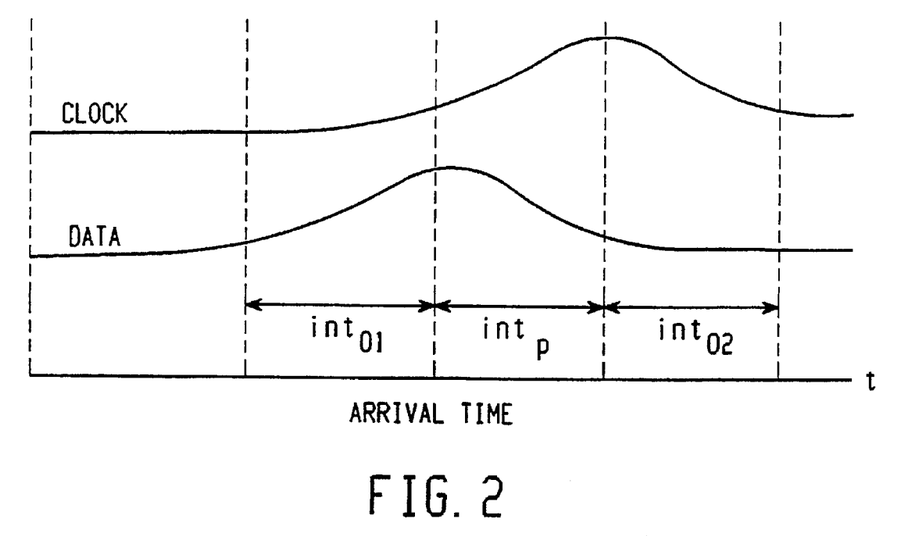
FIG. 2 represents a statistical distribution of the arrival times for a large number of data and clock signals propagated through a logic network.

Because manufacturing and environmental factors affect the delay of the logic networks implemented in different integrated circuit chips, and these factors exhibit some degree of correlation, statistical timing analysis is helpful in identifying potential timing problems in these networks. A sure method of verifying the performance of a particular design is to compare the latest possible arrival time of a particular signal which must arrive first to a test point against the earliest possible arrival time of a particular signal which must arrive last. For example, as shown in FIG. 2 which represents a statistical distribution of the arrival times for a large number of data and clock signals propagated through a logic network, a performance parameter dictates that a data signal must arrive before a clock signal. During the time interval $int_p$, some clock signals arrive before some data signals in the distribution, thereby violating the established performance parameter. Accordingly, one can assure performance of the analyzed circuit design by eliminating networks which exhibit timing characteristics within the time interval $int_p$.

However, such a method of analyzing the performance of a logic network design is overly pessimistic, because, as explained above, generally the networks within the same integrated circuit are manufactured under similar conditions and are subject to similar environmental variables, and thus their delays are usually well correlated. However, this degree of correlation is not total. Therefore, it is overly optimistic to verify the performance of a particular design by comparing only the earliest possible arrival times of the data signals with the earliest possible arrival times of the clock signals ($int_{o1}$) or by comparing only the latest possible arrival times of the data and clock signals ($int_{o2}$).

Statistical methods of analyzing timing information in logic networks which recognize the correlation of this timing information are known. Examples of such methods are the so-called Monte Carlo method, the method disclosed in U.S. Pat. No. 4,924,430, or the ETE (early timing estimator) method. In the Monte Carlo method, a large number of separate timing analyses are performed in which corresponding clock and data signals are propagated along a particular logic network. In each analysis, the delays for all networks are randomly selected based on the expected distribution of delays for the networks and the expected correlation between those delays. The differences in arrival times for clock/data signals (slack) is computed to determine the worst case difference. A network design passes the Monte Carlo test if none of the analyses shows a problem. Because hundreds or thousands of separate analyses may be needed to reach a confidence level that no problems exist, the Monte Carlo method is costly in both computer time and storage.

The method disclosed in U.S. Pat. No. 4,924,430 computes clock/data slacks for all integrated circuits by determining values for the absolute minimum and maximum delays experienced across all chips, a relative minimum delay for a chip assuming that another chip provides the absolute maximum delay, and a relative maximum delay for a chip assuming that another chip provides the absolute minimum delay. These four values are propagated to generate four arrival times at a plurality of test points, and comparisons are made between the absolute maximum and relative minimum delays and between the absolute minimum and relative maximum delays.

The ETE method, instead of computing individual slack times for clock/data signals, uses a statistical distribution of the arrival times for a large number of data and clock signals to calculate and propagate distributions of delays and arrival times, rather than single delay values. The distributions are used to identify nominal arrival times, the sums of the standard deviations (sigmas) of the arrival times, and the sums of the variances (sigmas squared) of the arrival times. The variance is the average of the squares of the deviations from the mean of the frequency distribution, and the standard deviation is the square root of the variance. Values for these statistical distribution components are propagated through the network. Assuming a normal distribution (a useful approximation), these values may be combined with correlation coefficients derived for individual delays to yield, at a test point, a distribution of test point slacks. If the slack distribution yields too high a probability of slack, the test fails.

Each of the non-Monte Carlo statistical methods, however, remain overly pessimistic because they ignore common portions of the network paths over which the clock and data signals are propagated. Signal arrival times are usually compared at latches, and the data and clock signals often share common path segments to the latch. As integrated circuits get bigger and clock distribution systems get longer, the common portions may increase. Except for the Monte Carlo analysis, the statistical timing analysis methods discussed above are overly pessimistic if the signals share a common path, because these methods assume that the entirety of the paths varies independently within the same allowed correlation, where in fact the delays for those segments where the signals overlap correlate perfectly since they in fact are the same delays.

Thus, it is an object of the present invention to provide a more accurate method of analyzing the timing synchronization variances in a logic network. It is a further object to provide such a method which eliminates the pessimism of non-Monte Carlo statistical methods of analyses, caused by the failure to recognize common path segments traversed by the analyzed signals, while at the same time preserving the computer storage and run time benefits of these methods.

SUMMARY OF THE INVENTION

A method for analyzing timing differences between arrival times of distinct signals propagating through a logic network is provided. The network comprises a plurality of circuit elements interconnected by a plurality of conductive paths. The method comprises the steps of first identifying a set of common points at which critical data and clock circuit paths may diverge (later referred to as CCPPS points). Data arrival times are then propagated to at least one data endpoint in the network, and are tagged with the common points (if any) through which they pass. During the propagation, data arrival times tagged with the same common point are merged, so that each data arrival time reaching a particular end point is tagged with a different common point. The propagated arrival times are not single numbers but instead are statistical distributions or ranges of arrival times.

Similarly, clock arrival times are then propagated to at least one clock endpoint in the network, and are tagged with the common points (if any) through which they pass. During the propagation, clock arrival times tagged with the same common point are merged, so that each clock arrival time reaching a particular end point is tagged with a different common point. The propagated arrival times are not single numbers but instead are statistical distributions or ranges of arrival times.

Each of the clock endpoints is identified with a corresponding data endpoint to constitute a plurality of data/clock end point pairs (tests). The slack due to each pair of data and clock arrival times at each end point pair is calculated. The data/clock arrival time pair having the worst slack is identified.

A common point at which clock and data paths causing the identified worst slack is determined from the common point tags associated with these arrival times. The propagation times from the common point to the data and clock end points are recalculated for the data/clock arrival time pair having the worst slack, this recalculated value being the corrected slack for this data/clock arrival time pair. This corrected slack is examined to determine if it is better than that of the data/clock arrival time pair having the next-to-worst slack. If it is not, the worst slack for this end point pair (test) has been identified.

However, if the corrected slack is better than that of the data/clock arrival time pair having the next-to-worst slack, this next-to-worst slack is now the new worst slack. The procedure outlined in the preceding paragraph is repeated. This process is continued until the corrected slack from the common points to the endpoints is worse than that of the data/clock arrival time pair which has the next-to-worst slack. At this point, the worst slack for the endpoint pair (test) has been identified.

DETAILED DESCRIPTION OF THE PREFERRED DRAWINGS

Figure 3:
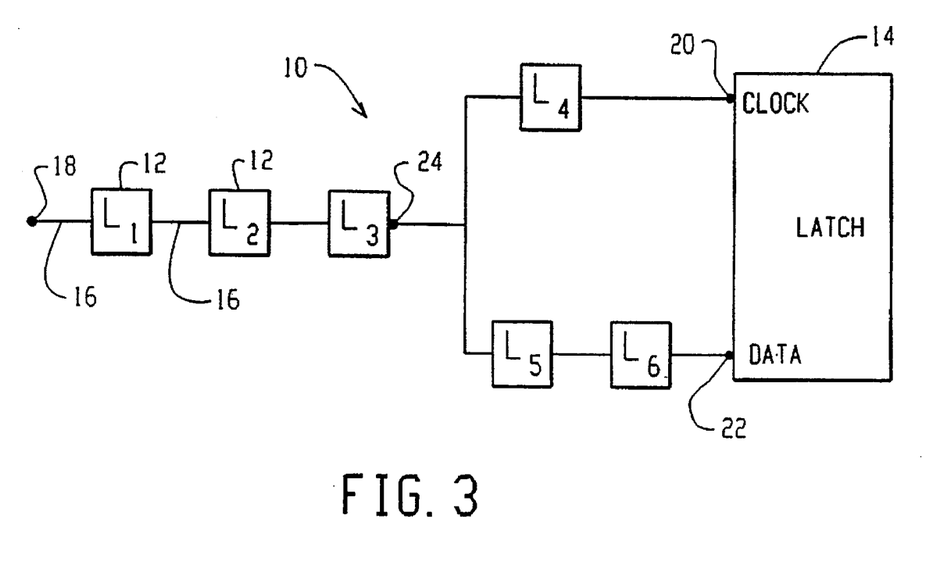
FIG. 3 is a circuit schematic of a logic network which may be tested by the present invention.

The present invention provides a method for analyzing the timing characteristics of a logic network 10, an example of which is shown in FIG. 3. The network 10 comprises a plurality of logic elements 12, including a latch 14, which are interconnected by a conductive path constructed of path segments 16. Input signals, specifically clock and data signals, are applied at input 18 and propagated through the logic elements, respectively, to the clock and data inputs 20, 22 of the latch 14. As shown in FIG. 3, The portion of the network which includes logic elements L1–L3 is common to both the clock and data signals. At the output 24 of logic element L3, the clock and data paths diverge; the clock signal is propagated through logic element L4 to the clock input 20 of the latch 14, and the data signal is propagated through logic elements L5–L6 to the data input 22 of the latch.

The present invention provides a logic network analysis method by which the synchronization of clock and data signals propagated through the network of FIG. 3 may be analyzed. The method accounts for timing variations which may occur due to the common portions of the network over which both data and clock signals are propagated, by eliminating these differences. The method may be implemented as an algorithm in a suitable timing analysis tool, such as EinsTimer™. This particular timing analysis tool performs a block oriented statistical timing analysis and is part of an electronic design automation system used to design IBM® RX/6000® follow-on products.

Specifically, the inventive method performs a timing analysis by computing slack between clock and data signals propagated through a logic network. Slack, generally, is the measure of the difference between the actual arrival time of a signal to a point in the network and the time at which the signal must arrive (required time). Slack at a test point can be generalized to slack at any point in the network by propagating actual arrival times through the network and then propagating required times backward through the network. The slack at the test point is the amount of margin, in terms of time, available to a designer of the network.

The inventive method may be used to perform either early or late mode analyses of logic networks. In an early mode analysis, data signals at test points are required to arrive after the clock signal. In a late mode analysis, data signals at test points are required to arrive before the clock signal (see FIG. 2). Thus, in a late mode analysis, the required times propagated along the data path are the upper limits on the actual arrival times of the data signal, or the latest time at which the data signal may arrive. The required times propagated along clock paths are the lower limits on the actual arrival of the clock signal, or the earliest time at which the clock signal may arrive. Points in the network which are in both the clock and data paths will then have two required times propagated, corresponding to the upper (latest) data limits and the lower (earliest) clock limits on the arrival time. The differences between these upper data limits and the lower clock limits and the actual data and clock arrival times are referred to, respectively, as the data slack and the clock slack. The signs of these slacks are chosen so that a negative slack represents a failure to meet an established timing requirement. In the context of late mode analysis, a clock slack will be negative if the clock signal arrives so early as to precede the lower clock limit, and a data slack will be negative if the data signal arrives so late as to exceed the upper data limit. In statistical timing analysis, the arrival and required times are not single numbers, but are instead distributions or ranges of values. These values are added, compared, and used to compute slack according to known methods. The arrival and required times referred to in this description will be understood to be such distributions or ranges of values.

Figure 4:
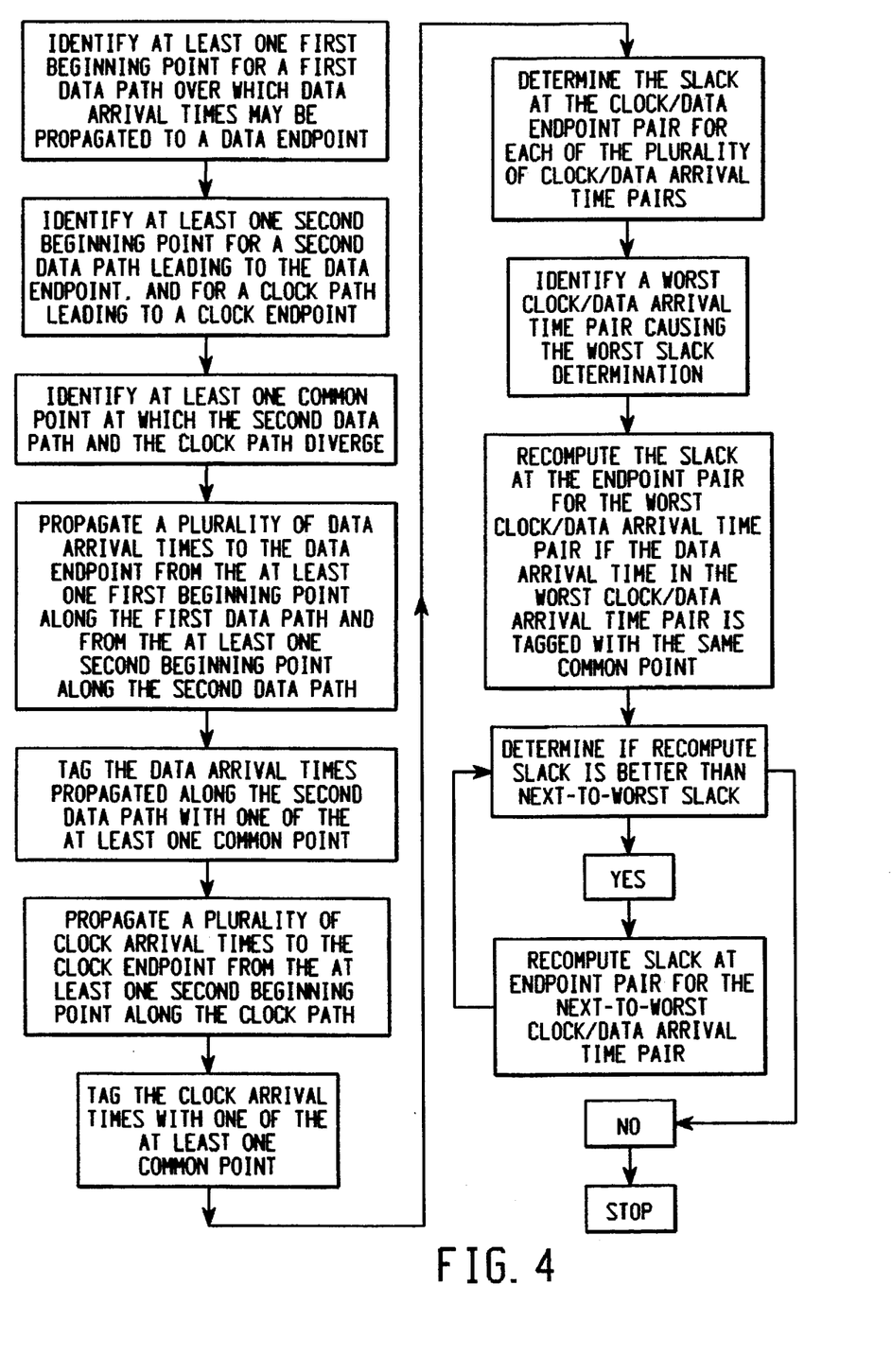
FIG. 4 is a flow diagram which outlines the method of network analyses of the present invention.

The method involves a sequence of steps (see FIG. 4) to compute the minimum slack between clock and data signals propagated through a logic network. First, points within the network to be tested are identified which may be the point of divergence for a critical clock/data path pair. Timing variations which result from clock and data signals traversing common paths are of concern to the designer if the network test fails only because of these common path variations. Accordingly, the common portions of the network which are of concern are those leading to points in the network (i) at which both the clock and data slack are negative, and (ii) which feed other points in the network which have a negative clock slack or a negative data slack but not both. These points are referred to as the critical common path point set (CCPPS). There is no need to identify common path points which have both negative clock and negative data slacks and which feed only other points which also have a negative clock and data slack.

As further explained below, each clock or data arrival time is tagged to identify the CCPPS points in the network through which it was computed. A tag is also provided for these signals even if they do not do not pass through any of the CCPPS points, the "null" tag, which is considered to be an element of the set of CCPPS points.

The CCPPS, being a smaller subset than the entire set of points defining the common clock/data portions of the network identified above, may be identified by running an initial statistical timing analysis on the points defining the common clock/data portions of the network to determine the points having both negative clock and data slacks. In some cases, the designer knows, because of the network topology or a particular design style, where negative clock slack and negative data slack may occur. In such a case, these identified potential points may be placed in the CCPPS, eliminating the need for the initial statistical timing analysis.

Figure 5:
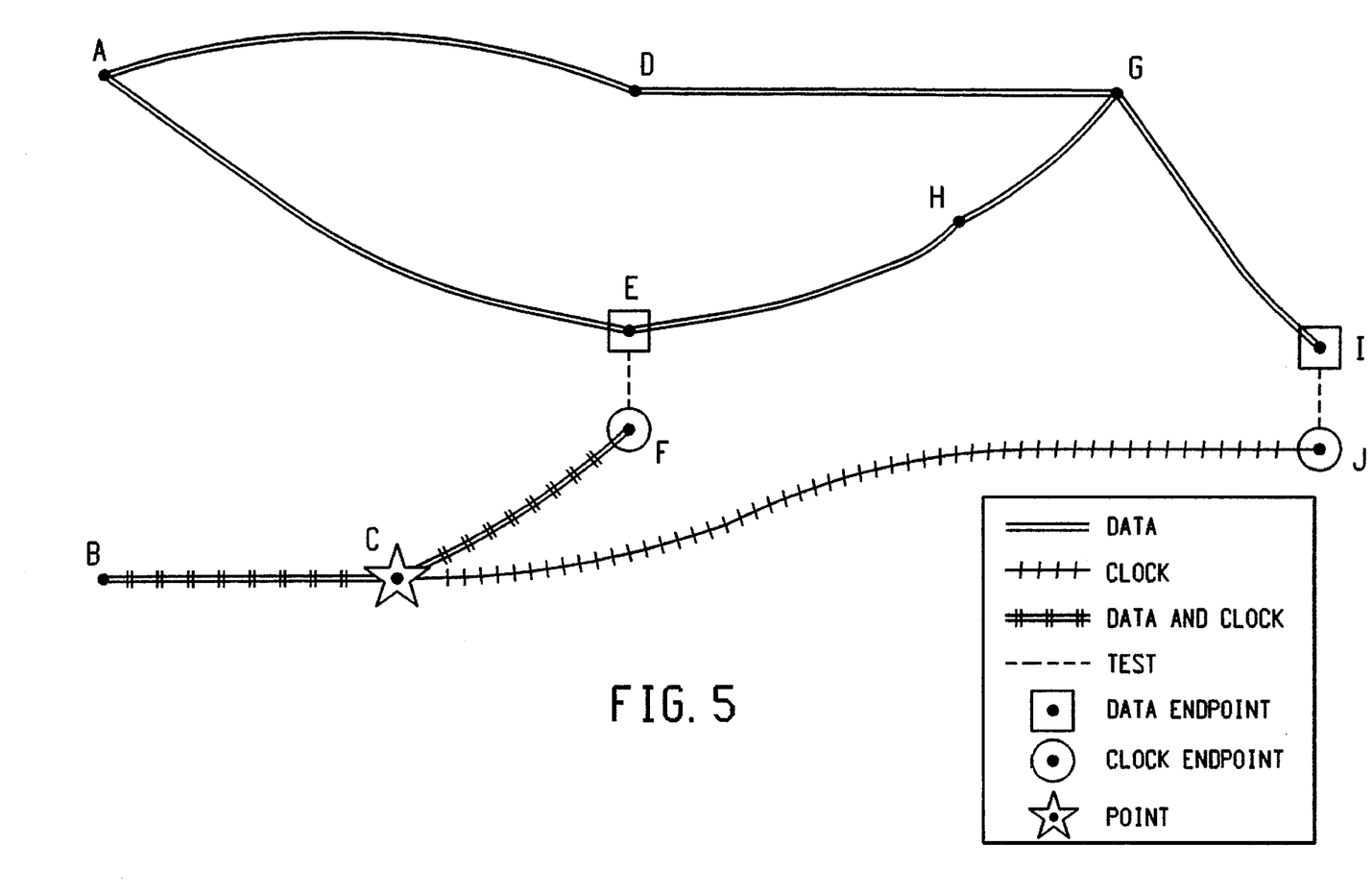
FIG. 5 is a diagram of another logic network, showing test points at which the network is analyzed using the present invention.

Once the CCPPS has been identified, clock and data arrival times are propagated throughout the network in a conventional manner from inputs to various test points in the network via the CCPPS. FIG. 5 shows a nodal circuit diagram wherein points A and B are inputs to the network to be tested, point C is a point in the CCPPS, and points E–F and I–J are test point pairs. For test points having more than one path to them (e.g., test point I) clock and data arrival times are propagated along each possible path to that point. In this manner arrival times for clock and data signals are identified at each test point.

After the arrival times $A_i$ are computed at a test point (i=1 to the number of CCPPS points from which arrival times were propagated to the test points, including the null element if appropriate), the arrival times are sorted such that $A_{i+1} \leq A_i$ for late mode analysis and $A_{i+1} \geq A_i$ for early mode analysis. It is assumed that $P_i$ is the maximum possible pessimism for the test point for arrival time $A_i$, i.e. $P_i$ is the difference between the late and early arrival times at the CCPPS element which tags $A_i$. So the most optimistic adjusted arrival time possible at a point is $A_i-P_i$ for late mode arrival times and $A_i+P_i$ for early mode arrival times. Thus, if for any $A_i$, there is some other $A_j$ whose optimistic adjusted arrival time is still worse than the unadjusted $A_i$, that $A_i$ can be dropped from consideration and not propagated. With the sorting of arrival times as described above, this means that if for any late arrival time $A_j$, $A_i$ is less than or equal to $\max_{(j<i)}(A_j-P_j)$, or for any early mode arrival time $A_i$ is greater than or equal to $\min_{(j<i)}(A_j+P_j)$, then all $A_k$, k is greater than or equal to i, may be dropped, reducing the number of arrival times which must be propagated.

For test points having paths from more than one CCPPS element, there may be as many tagged clock or data arrival times as there are CCPPS elements with paths to that point. Accordingly, at the test point are a plurality of tagged clock and data arrival times sorted in order of those arrival times.

If a clock and data pair are tagged with the same CCPPS element, the rightmost common point in their respective paths is that CCPPS element. In some cases, clock and data arrival times may not pass through any identified CCPPS points. In these cases, the arrival times are tagged with the null element of the CCPPS to indicate that the clock or data arrival time is not derived from any CCPPS element. A clock or data arrival time tagged with the null CCPPS element indicates that arrival time was propagated along a path which did not pass through any CCPPS points. As shown in FIG. 5, arrival times passing through CCPPS point D are tagged with the null element because only data signals are propagated along the path on which point D resides.

After the data and clock arrival times are propagated, data/clock slack computation at the test points is performed, based on the CCPPS tags and the arrival time sorts. Slack at a test is defined as the difference in time between the actual arrival time of a clock signal and the actual arrival time of a data signal to a particular test point in the network.

The normal slack computation at these test points takes a statistical difference between the data and clock arrival times to determine the correct correlation coefficients to use in computing the slack. In the method of U.S. Pat. No. 4,924,430, slack computation is done by first adjusting the relative minimum arrival time, before using it to compute the slack, by adding the difference between the absolute maximum and relative minimum arrival times at the test point. Similarly, the relative maximum arrival time is adjusted by subtracting the difference between the relative maximum and absolute minimum arrival times at the test point. In the ETE method, slack computation is accomplished by propagating the nominal arrival time, the sum of the delay sigmas (standard deviations), and the sum of the squares of the delay sigmas (variances). The sigma sums and the sigmas squared sums from the common point are then subtracted from those of both the clock and data at the test point before the slack is computed.

In the present invention, the common path variation is eliminated from the worst statistical slack computed at the test point by recognizing that perfect correlation exists between common portions of the clock and data paths. Because each of the tagged clock and data arrival times at the test point represents the arrival time of the signal along a path through the CCPPS element with which it is tagged, the slack at that test point is that of the worst clock/data arrival time pair. The sorted distribution of clock arrival times and data arrival times is used to determine the worst case slack at each test point. For example, in a late mode analysis, worst slack for a clock/data pair is the difference between the earliest clock arrival time and the latest data arrival time. Conversely, in an early mode analysis, worst slack for a clock/data pair is the difference between the latest clock arrival time and the earliest data arrival time. Because the remainder of the distributions of clock and data arrival times are also sorted, the second worst data/clock slack, the third worst data/clock slack, and so on, may be determined for the rest of the clock/data arrival time pairs.

To identify the common path variations which may be removed from the computed statistical slack, the CCPPS tags are compared for the clock/data arrival time pair for which the slack is being computed. If the clock and data arrival times in a pair have the same CCPPS tag, this is the point at which the paths diverge (i.e. their rightmost common point), and thus the pessimism contributed to the originally computed worst case slack is the entire arrival time variation of that common point may be removed. (The pessimism attributed to the common portion of the circuit is added to the slack which was previously computed for the clock/data signal pair.) If one of the clock or data arrival times is untagged or tagged with the null element of the CCPPS, no common portions of the circuit exist, and thus no pessimism may be removed from the originally computed worst case slack. (The pessimism for an untagged arrival time, or for an arrival time which has been tagged with the null element of the CCPPS, is zero.) If, however, the clock and data have a different CCPPS element, both clock and data arrival times must be traced back, using the tags, to determine the common portion of the clock and data paths, and the point at which the paths diverge.

Because the CCPPS elements are the rightmost points which could possibly be in both the clock and data paths to a failing test point (i.e., both negative clock and data slacks), it is possible to trace back to find a possible common path point from the CCPPS elements with which the arrival times were tagged.

It is possible that many paths could lead to the same CCPPS element. However, most of the CCPPS points will be within the clock generation and distribution network on the integrated circuit which is typically designed so that a single predetermined path to each point in the network controls the arrival time of the signal at that point. Thus, the path points will generally form a tree (as in FIG. 5) wherein each point generally has only one predecessor CCPPS point. The trace back process, therefore, permits tracing back along a single path in the tree to find a rightmost common point for both the data and clock arrival times.

In many cases, this traceback process will determine that the paths for the clock and data arrival times being compared share no common portion. To identify these cases more quickly, we may associate with each CCPPS element the leftmost point in the path leading to it at which pessimism may be removed. Any two points which share common paths will then have the same leftmost point. Thus, if the leftmost points associated with the CCPPS elements tagging a clock and data arrival time do not match, we immediately know that there is no common path portion, and the traceback procedure is not needed. In this case, no pessimism is removed from the originally computed worst case slack.

The rightmost common point for the data/clock pair corresponding to the worst slack is found by tracing the path back using the tags applied to that pair, as explained above. The worst case slack is then re-computed excluding the variation at that rightmost common point, or point of divergence. Because this worst case re-computation adjusts the slack in a positive direction to improve the slack, it is possible that the re-computed worst slack is now better (less negative) than the originally computed second worst case slack. If it is, the originally computed second worst case slack is re-computed, excluding the variation at the point of divergence from each path, to arrive at a re-computed second worst slack value. The re-computed second worst case slack is compared to the originally computed third worst case slack. This process is done repeatedly until the next-worst slack is either positive, in which case the test is deemed to pass, or the re-computed slack is no better than the next worst originally computed slack. If the re-computed slack is no better than the next worst slack (before re-computation), further re-computation of slack would be meaningless because the re-computation could not possibly result in a bettering of the slack. Because the exclusion of common path variation can only better the slack value, this process will always provide the worst slack at the test point. In this manner, the worst slack for the analyzed circuit path is identified while eliminating slack variations caused by the common portions of the path over which both the clock and data signals traverse. Based on this information, the circuit designer determines if a predetermined performance objective has been met by the design. If it has not, the circuit is redesigned and tested again. This process is repeated by the circuit designer until an acceptable design has been identified and then the circuit is implemented in hardware form using known implementation methods.

The reason for computing the worst slack without common path exclusion is that finding the common point may be somewhat costly. It may also be possible, by selectively ordering the arrival times, to identify the clock/data pair causing the worst slack without computing slacks for all pairs. If neither is the case, one can merely find the common points for all arrival time pairs, compute the slacks for each pair excluding common path variation, and use the worst result.

An optional step in the method is to propagate required arrival times back from test points to find slacks at other points in the network, in addition to the test points. This step is not needed if the objective is simply to determine whether the network passes or fails at the test points, but can be used to help identify other internal points in the network contributing to any problems found during the analysis. The method is basically the same as that normally used to compute slacks at internal points in a network, by propagating required times back from test points and computing the slack at any point as the difference between the required and arrival times at that point. In this case, however, several differently tagged arrival times are propagated forward to the test points. As a result, these arrival times will result in several differently tagged required times being propagated backward through the network. The tags on the data arrival times will be propagated back on the clock required times, and the tags on the clock arrival times will be propagated back on the data required times. The common path variation for two differently tagged values is then found and excluded as explained above, including the preliminary pruning step. In addition, as the required times are propagated backward, any required time whose leftmost point is not the same as that of any of the arrival time tags at a point may be untagged, or in other words merged with any other required time which does not have a tag at the point.

The inventive method of the present invention also provides alternative means for determining which arrival times and CCPPS points are to be propagated to any given point in the network. As above, the CCPPS points are identified by performing an initial statistical analysis. Based on this analysis, worst case slack is determined at a particular test point by tracing back arrival times which cause the worst case slack at that point. The clock and data arrival times contributing to this worst case slack are traced back until (i) one of the predefined CCPPS points is reached, or (ii) another point is reached having one or more arrival times tagged with CCPPS points. Tagged arrival times, identified by the appropriate CCPPS points, are then propagated forward from these points along the traced paths. Non-tagged arrival times from the latest/earliest side paths are also propagated forward.

A new slack is re-computed using these tagged times by removing the common path pessimism, as discussed above. If the new re-computed slack is still worse than the next-worst newly computed slack, no further re-computation is performed. Otherwise, if the originally computed worst slack is again due to a comparison between a clock and data arrival time, at least one of which is untagged, the clock and data paths contributing to this slack are traced back along the new untagged paths, repeating these two steps until the worst slack is in fact due to a comparison of clock and data arrival times both of which have tagged arrival times. Such a method avoids the problem of repeatedly tracing the same subpaths by storing the tagged arrival times along the backtraced path, allowing the method to stop tracing when a point with such a tagged time is encountered.

Accordingly, a preferred method for analyzing the timing characteristics of logic networks has been provided, wherein slack is computed by excluding variation in common network paths shared by clock and data signals. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

We claim:

1. A statistical method of analyzing timing differences between arrival times of distinct signals propagating through an electronic circuit comprising a plurality of circuit elements interconnected by a plurality of conductive paths, the method comprising the steps of:

(i) identifying at least one first beginning point for a first data path over which data arrival times may be propagated to a data endpoint;

(ii) identifying at least one second beginning point for a second data path leading to said data endpoint, and for a clock path leading to a clock endpoint, said data and clock endpoints constituting an endpoint pair;

(iii) identifying at least one common point at which said second data path and said clock path diverge;

(iv) propagating a plurality of data arrival times to said data endpoint from said at least one first beginning point along said first data path and from said at least one second beginning point along said second data path, and tagging said data arrival times propagated along said second data path with one of said at least one common point;

(v) propagating a plurality of clock arrival times to said clock endpoint from said at least one second beginning point along said clock path, and tagging said clock arrival times with one of said at least one common point, said plurality of data and clock arrival times constituting a plurality of clock/data arrival time pairs at said endpoint pair;

(vi) determining the slack at said endpoint pair for each of said plurality of clock/data arrival time pairs and identifying a worst clock/data arrival time pair causing the worst slack determination; and (vii) recomputing the slack at said endpoint pair for said worst clock/data arrival time pair, if the data arrival time in said worst clock/data arrival time pair is tagged with the same common point, by eliminating slack which is caused by data and clock arrival time propagation on a shared portion of said second data path and said clock path between said at least one second beginning point and said same common point.

2. The method of claim 1 further comprising the steps of:
(viii) determining if the recomputed slack is better than the slack resulting from the next-to-worst clock/data arrival time pair, and if so,
(ix) recomputing the slack for the next-to-worst clock/data arrival time pair, if the data arrival time in said next-to-worst clock/data arrival time pair is tagged with the same common point, by eliminating slack which is caused by data and clock arrival time propagation on a shared portion of said second data path and said clock path between said at least one second beginning point and said same common point.

3. The method of claim 2, further comprising the steps of repeating steps (viii) and (ix) until the recomputed slack is worse than the slack resulting from the next-to-worst clock/data arrival time pair.

4. The method of claim 3, further comprising the steps of (x) determining if the final recomputed slack meets a predetermined performance objective, and (xi(a)) redesigning said circuit if said performance objective is not met, or (xi(b)) implementing said circuit in hardware form.

5. The method of claim 4, wherein said circuit meets a predetermined performance objective if said slack is a nonnegative number.

6. The method of claim 1, wherein said plurality of data and clock arrival times comprises, respectively, statistical distributions of data and clock arrival times.

7. The method of claim 1, wherein said plurality of clock/data arrival time pairs at said endpoint pair are formed by first sorting said data arrival times and said clock arrival times in order of time of arrival.

* * * * *